United States Patent
Lee et al.

(10) Patent No.: US 10,400,370 B2
(45) Date of Patent: *Sep. 3, 2019

(54) NONWOVEN FABRIC OR NONWOVEN COMPOSITE MATERIAL FOR SHIELDING AND ABSORBING ELECTROMAGNETIC WAVE

(71) Applicant: BULLSONE MATERIAL CO., LTD., Incheon (KR)

(72) Inventors: Jong Gil Lee, Incheon (KR); Soo Hyung Hur, Seoul (KR); Min Young Park, Incheon (KR); Byung Rok Kang, Incheon (KR); Ji Hun Kang, Chungcheongnam-do (KR)

(73) Assignee: BULLSONE MATERIAL CO., LTD., Incheon (KR)

( * ) Notice: Subject to any disclaimer, the term of this patent is extended or adjusted under 35 U.S.C. 154(b) by 362 days.

This patent is subject to a terminal disclaimer.

(21) Appl. No.: 15/105,893

(22) PCT Filed: Dec. 10, 2014

(86) PCT No.: PCT/KR2014/012138
§ 371 (c)(1),
(2) Date: Jun. 17, 2016

(87) PCT Pub. No.: WO2015/093777
PCT Pub. Date: Jun. 25, 2015

(65) Prior Publication Data
US 2016/0319471 A1    Nov. 3, 2016

(30) Foreign Application Priority Data
Dec. 20, 2013 (KR) .......................... 10-2013-0159989

(51) Int. Cl.
*D04H 1/4242* (2012.01)
*B32B 37/24* (2006.01)
(Continued)

(52) U.S. Cl.
CPC ........... *D04H 1/4242* (2013.01); *B32B 5/022* (2013.01); *B32B 5/08* (2013.01); *B32B 7/06* (2013.01);
(Continued)

(58) Field of Classification Search
CPC .... D04H 1/4242; D04H 1/4234; C23C 14/00; B32B 5/08; B32B 7/06; B32B 27/12;
(Continued)

(56) References Cited

U.S. PATENT DOCUMENTS 5,393,379 A * 2/1995 Parrinello .................. C08J 5/06
162/101
5,506,047 A * 4/1996 Hedrick .................... B32B 5/18
428/307.7
(Continued)

FOREIGN PATENT DOCUMENTS

JP    61-225398    7/1986 ............... D21H 5/00
JP    10-46443     2/1998 ............. D03D 15/00
(Continued)

OTHER PUBLICATIONS

Nonwoven, Textile Glossary, Celanese Acetate, copyright 2001 (Year: 2001).*
(Continued)

*Primary Examiner* — Jennifer A Steele
(74) *Attorney, Agent, or Firm* — Harness, Dickey & Pierce, P.L.C.

(57) ABSTRACT

The present invention relates to a nonwoven fabric or nonwoven composite material comprising the nonwoven fabric for shielding and absorbing electromagnetic waves,
(Continued)

manufactured by using a carbon fiber plated with metal (copper and nickel) produced in an electroless or electrolysis continuous process. The nonwoven fabric of the present invention is thinner and stronger than the conventional art, and has an advantage of being capable of controlling conductivity by controlling only the content of the carbon fiber plated with metal, without need for further addition of conductive powder.

8 Claims, 9 Drawing Sheets

(51) Int. Cl.
| | |
|---|---|
| B32B 27/36 | (2006.01) |
| B32B 27/12 | (2006.01) |
| B32B 7/06 | (2019.01) |
| B32B 5/08 | (2006.01) |
| B32B 5/02 | (2006.01) |
| B32B 7/12 | (2006.01) |
| D04H 1/4234 | (2012.01) |
| H05K 9/00 | (2006.01) |
| D06M 11/83 | (2006.01) |
| C23C 18/16 | (2006.01) |
| D06M 101/40 | (2006.01) |

(52) U.S. Cl.
CPC ............... *B32B 7/12* (2013.01); *B32B 27/12* (2013.01); *B32B 27/36* (2013.01); *B32B 37/24* (2013.01); *C23C 18/1633* (2013.01); *C23C 18/1639* (2013.01); *C23C 18/1653* (2013.01); *D04H 1/4234* (2013.01); *D06M 11/83* (2013.01); *H05K 9/009* (2013.01); *B32B 2260/021* (2013.01); *B32B 2260/04* (2013.01); *B32B 2260/046* (2013.01); *B32B 2262/106* (2013.01); *B32B 2262/12* (2013.01); *B32B 2307/202* (2013.01); *B32B 2307/212* (2013.01); *B32B 2307/4023* (2013.01); *B32B 2307/748* (2013.01); *B32B 2307/75* (2013.01); *B32B 2405/00* (2013.01); *B32B 2451/00* (2013.01); *D06M 2101/40* (2013.01)

(58) Field of Classification Search
CPC ......... B32B 27/36; B32B 37/24; B32B 5/022; B32B 7/12; B32B 2307/4023; B32B 2307/748; B32B 2262/106; B32B 2405/00; B32B 2262/12; B32B 2260/04; B32B 2451/00; B32B 2307/202; B32B 2307/75; B32B 2260/046; B32B 2260/021; B32B 2307/212; H05K 9/009; D06M 11/83; D06M 2101/40; Y10T 442/188; Y10T 442/259; Y10T 442/2598; Y10T 442/2607; D21H 13/48; D21H 13/50; C09J 9/02

See application file for complete search history.

(56) References Cited

U.S. PATENT DOCUMENTS

| | | | | |
|---|---|---|---|---|
| 5,827,997 | A | 10/1998 | Chung et al. | 174/35 |
| 5,939,190 | A * | 8/1999 | Pfaff | C09J 7/0296 |
| | | | | 428/344 |
| 6,045,680 | A * | 4/2000 | Cawston | C23C 18/1644 |
| | | | | 205/138 |
| 6,361,726 | B1 * | 3/2002 | Kim | D21H 27/10 |
| | | | | 264/87 |
| 9,890,280 | B2 * | 2/2018 | Lee | B29C 70/882 |
| 2002/0108699 | A1 | 8/2002 | Cofer et al. | 156/176 |
| 2002/0153110 | A1 * | 10/2002 | Yamaguchi | B32B 29/00 |
| | | | | 162/123 |
| 2003/0224111 | A1 * | 12/2003 | Suganuma | C23C 18/1632 |
| | | | | 427/305 |
| 2008/0237911 | A1 * | 10/2008 | Ardiff | B32B 5/08 |
| | | | | 264/129 |
| 2008/0283186 | A1 * | 11/2008 | Rapp | B29C 70/02 |
| | | | | 156/276 |
| 2009/0176074 | A1 * | 7/2009 | Sotendahl | D21H 15/00 |
| | | | | 428/208 |

FOREIGN PATENT DOCUMENTS

| | | | |
|---|---|---|---|
| JP | 2002-266281 | 9/2002 | ............ D21H 13/26 |
| JP | 2009-135526 | 6/2009 | ............ H05K 9/00 |
| KR | 10-2000-0034190 | 6/2000 | ............ D06M 11/83 |
| KR | 10-2000-0039345 | 7/2000 | ............ H05K 9/00 |
| KR | 10-2006-0039465 | 5/2006 | ............ H05K 9/00 |
| KR | 10-2009-0031184 | 4/2009 | ............ H05K 9/00 |
| KR | 10-2009-0057726 | 6/2009 | ............ B82B 3/00 |
| KR | 10-0929328 | 11/2009 | ............ A45C 11/00 |
| KR | 10-2010-0112744 | 10/2010 | ............ H05K 9/00 |
| KR | 10-2011-0078254 | 7/2011 | ............ D06M 14/36 |
| KR | 10-2012-0003259 | 1/2012 | ............ D06M 11/49 |
| KR | 10-1213380 | 12/2012 | ............ H05K 9/00 |

OTHER PUBLICATIONS

Office Action—Decision to Grant a Patent of JP Patent Application No. 2016-559135 dated Aug. 1, 2017 (with English translation).
International Search Report (ISR) in PCT/KR2014/012138, dated Feb. 3, 2015 published in WO 2015/093777.

* cited by examiner

NONWOVEN FABRIC OR NONWOVEN COMPOSITE MATERIAL FOR SHIELDING AND ABSORBING ELECTROMAGNETIC WAVE

CROSS-REFERENCE TO RELATED APPLICATIONS

This application is a national phase application of PCT Application No. PCT/KR2014/012138, filed on Dec. 12, 2014, which claims the benefit and priority to Korean Patent Application No. 10-2013-0159989, filed Dec. 20, 2013. The entire disclosures of the applications identified in this paragraph are incorporated herein by references.

FIELD

The present invention relates to a nonwoven fabric for shielding and absorbing electromagnetic waves manufactured by using metal (copper and nickel)-plated carbon fibers prepared through continuous electroless and electrolytic processes, and to a nonwoven composite material containing the same.

BACKGROUND

An electromagnetic wave is typically composed of two types of waves, i.e., an electric wave and a magnetic wave, in which a higher frequency leads to a shorter wavelength and a higher energy level, and a lower frequency leads to a lower energy level. It is known that, while the electric wave is blocked by electrified metallic, conductive materials, the magnetic wave penetrates metallic, conductive materials, and, thus, a separate absorber is needed to block the magnetic wave. Since the electric and magnetic waves coexist, they are both extinguished when only one of both is removed Therefore, a conductive metal is generally used for the purpose of shielding electric wave, and a magnetic material is generally used for the purpose of shielding magnetic wave.

The magnetic material is one or an alloy of two of iron-based metals, for examples, iron (Fe), nickel (Ni), cobalt (Co), and the like.

The decibel (dB) is a measure of the effect of electromagnetic wave shield, which is the ratio of electromagnetic waves intensity before and after shielding. The effectiveness of 20 dB means the reduction of the amount of electromagnetic waves to 1/10, and the effectiveness of 40 dB means the reduction of the amount of electromagnetic waves to 1/100. It is generally determined that the shielding effect is favorable at 30-40 dB or more. In order to protect electronic devices and human bodies from the harmfulness caused by the generation of electromagnetic waves, regulations have been tightened around the globe, and respective countries are tightening EMI regulations. Following this trend, a metal substrate is used, or a conductive coating or plating is applied to the substrate, for electromagnetic waves shield. The metal substrate has disadvantages in that it is not suitable for a complicated pattern process and it is heavy. Moreover, the method of substrate plating is not advantageous in view of the productivity due to complicated processes therefor, such as degreasing, etching, neutralizing, activating, accelerating, metal depositing, activating, and primary to tertiary plating steps. Moreover, shielding materials using a filler, such as carbon nanotubes, a metal powder, graphite, or ferrite, have been reported, but they show defects in dispersibility, processability, effectiveness of electromagnetic waves shield, and the like. Metal plating is applied to the filler in order to solve the disadvantages, but such a plating manner using a conductive powder is difficult for practical use due to delicate processes and high production costs.

As for recent techniques associated with electromagnetic waves shield, U.S. Pat. No. 5,827,997 discloses the complexation of nickel fibers, or carbon filaments plated with nickel through electroplating, with a polymer resin; US Patent Publication No. 2002/0108699 discloses the complexation of conductive fibers with a resin; Korean Patent Application No. 10-2009-0031184 discloses an electromagnetic waves shield film containing carbon nanotubes; Korean Patent Application No. 10-2006-0039465 discloses a method for manufacturing an electromagnetic waves shield film; Korean Patent Application No. 10-2000-0039345 discloses a material for electromagnetic waves shield using carbon nanotubes or carbon nanofibers; and Korean Patent Application No. 10-2009-0057726 discloses a method for preparing a polymer/carbon nanotube composite with excellent effectiveness of electromagnetic waves shield.

In addition, disclosed is a method for manufacturing a fabric for the purpose of electromagnetic waves shield by plating organic synthetic fibers. Japanese Patent Publication No. Hei 10-46443 discloses a fabric for electromagnetic waves shield. This patent is directed to a technique of manufacturing a shield fabric by silver-plating nylon, followed by weaving and arrangement, wherein the shield fabric has an effect of electromagnetic waves shield of 26-30 dB. Korean Patent Publication No. 2000-0034190 discloses that nylon short fibers or filaments were plated with silver, and the silver-plated fibers are mixed with other fabrics in a twisting step The above technique results in an effect of electromagnetic waves shield of about 26-38 dB.

Korean Patent Nos. 10-0929328 and 10-1213380 discloses a nickel-copper-nickel-plated fabric formed of organic fibers, which is used as a material for electromagnetic waves shield. This fabric shows a performance of electromagnetic waves shield of 54-62 dB. However, since the fabric acts like a metal plate after being plated, the magnetic shielding effect is shown by reflection, and thus the plated fabric is not differentiated from a metal plate of copper or the like. Moreover, when the plated fabric is used as a magnetic shielding material for a cellular phone and an electronic device, the damage to the electronic device by reflection waves and the harmfulness to the human body by diffraction of reflection waves are inevitable.

Throughout the entire specification, many papers and patent documents are referenced and their citations are represented. The disclosure of the cited papers and patent documents are entirely incorporated by reference into the present specification and the level of the technical field within which the present invention falls, and the details of the present invention are explained more clearly.

CONTENTS OF THE INVENTION

Technical Problem

The present inventors have endeavored to develop a composite film or sticker with excellent effectiveness of shielding and absorbing electromagnetic waves. As a result, the present inventors have verified that a nonwoven fabric, which is manufactured using carbon fibers plated with metals (copper and nickel) through continuous electroless and electrolytic processes, exhibits highly conducive characteristics even with a small content of carbon fibers or a smaller thickness, as compared with the conventional art, thereby producing excellent effectiveness of shielding and absorbing electromagnetic waves, and have further verified that a composite film or sticker, which is manufactured by laminating finish films on both surfaces of the nonwoven fabric used as a core or laminating a finish film on one surface of the nonwoven fabric and a double-sided adhesive film on the other surface thereof, has excellent effectiveness of shielding and absorbing electromagnetic waves, shows an aesthetic appearance, and is simply attachable to electronic devices, and have thus completed the present invention.

Accordingly, an aspect of the present invention is to provide a method for manufacturing a nonwoven fabric for shielding and absorbing electromagnetic waves.

Another aspect of the present invention is to provide a nonwoven fabric for shielding and absorbing electromagnetic waves manufactured by the above-mentioned method.

Still another aspect of the present invention is to provide a film type nonwoven composite material for shielding and absorbing electromagnetic waves.

Still another aspect of the present invention is to provide a sticker type nonwoven composite material for shielding and absorbing electromagnetic waves.

Other purposes and advantages of the present disclosure will become more obvious with the following detailed description of the invention, claims, and drawings.

Means for Solving Problems

In accordance with an aspect of the present invention, there is provided a method for manufacturing a nonwoven fabric for shielding and absorbing electromagnetic waves, the method including: (a) cutting copper and nickel-plated carbon fibers, which are obtained by continuous electroless and electrolytic processes, into chopped carbon fibers with a length of 3-500 mm; (b) mixing the chopped copper and nickel-plated carbon fibers, which correspond to a resultant product in step (a), with water at a weight ratio of 1:100-600, followed by dispersing; (c) adding 3-30% (w/v) of the resultant product in step (b) to water, followed by dispersing; and (d) filtering the resultant product in step (c) to remove water.

The present inventors have endeavored to develop a composite film or sticker with excellent effectiveness of shielding and absorbing electromagnetic waves. As a result, the present inventors have verified that a nonwoven fabric, which is manufactured using carbon fibers plated with metals (copper and nickel) through continuous electroless and electrolytic processes, exhibits highly conducive characteristics even with a small content of carbon fibers or a smaller thickness, as compared with the conventional art, thereby producing excellent effectiveness of shielding and absorbing electromagnetic waves, and have further verified that a composite film or sticker, which is manufactured by laminating finish films on both surfaces of the nonwoven fabric used as a core or laminating a finish film on one surface of the nonwoven fabric and a double-sided adhesive film on the other surface thereof, has excellent effectiveness of shielding and absorbing electromagnetic waves, shows an aesthetic appearance, and is simply attachable to electronic devices.

Hereinafter, the method for manufacturing a nonwoven fabric for shielding and absorbing electromagnetic waves using carbon fibers plated with copper and nickel through continuous electroless and electrolytic processes will be described in detail by steps.

(a) Cutting Copper and Nickel-plated Carbon Fibers into Chopped Carbon Fibers

First, the method of the present invention includes step (a) of cutting carbon fibers, which are plated with copper and nickel through continuous electroless and electrolytic processes, into chopped carbon fibers with a length of 3-500 mm.

The carbon fibers used in the present invention may include various carbon fibers known in the art. The carbon fibers may be commercially purchased, or may be prepared from polyacrylonitrile (PAN)-based or pitch-based materials.

The average diameter of the carbon fibers used in the present invention is 7 μm, and 7.25-9.5 μm if including a plating thickness, but the fiber diameter is not particularly limited.

The carbon fibers used in the present invention may be plated with various metals known in the art. However, for imparting superior conductivity to the carbon fibers, copper and nickel-plated carbon fibers obtained by applying continuous electroless and electrolytic processes may be used.

The copper and nickel-plated carbon fibers obtained by applying continuous electroless and electrolytic processes, used in the present invention, will be described later. A cross-sectional image of a copper and nickel-plated carbon fibers prepared by continuous electroless and electrolytic processes is shown in FIG. 1.

With respect to the metal (copper and nickel)-plated carbon fibers used in the present invention, in consideration of various factors (such as workability, surface resistance value, and dispersibility), the length of the metal-plated carbon fibers is not particularly limited, but, for the improvement in the dispersibility in an aqueous solution and the distribution at the time of manufacturing a nonwoven fabric, the metal-plated carbon may be processed in a chopped state, as shown in FIG. 6. The length of the carbon fibers may be processed into 3-500 mm depending on the purpose, preferably 3-100 mm, more preferably 3-50 mm, and still more preferably 3-20 mm, and carbon fibers with the same length may be used, or carbon nanofibers with different lengths may be mixed and used.

(b) Dispersing the Chopped Copper and Nickel-plated Carbon Fibers in Water

Then, the chopped copper and nickel-plated carbon fibers, which correspond to a resultant product in step (a), with water at a weight ratio of 1:100-600, followed by dispersing.

According to an example of the present invention, the dispersing may be carried out at a rate of 2,000-10,000 rpm.

According to another example of the present invention, the chopped metal-plated carbon fibers are mixed in an aqueous solution at a weight ratio of 1:100-500, and dispersed in water at a rate of 4,000-6,000 rpm.

According to another example of the present invention, the mixing in step (b) is performed by further adding natural pulp or a low-melting thermoplastic resin as a nonwoven fabric strength reinforcing agent.

The natural pulp used to reinforce the strength of the nonwoven fabric is not particularly limited, but various kinds of pulp that are known in the art and prepared by disintegrating normal woods into fibers may be used.

For the low-melting thermoplastic resin used to reinforce the strength of the nonwoven fabric, various low-melting thermoplastic resins known in the art may be used, and more preferably, low-melting polyethylene terephthalate (LM-PET) may be used.

According to still another example of the present invention, the nonwoven fabric strength reinforcing agent used in the manufacturing of the nonwoven fabric of the present invention is added in a 1-50 wt %, more preferably 1-30 wt %, and still more preferably 10-30 wt %, on the basis of the total weight of the chopped copper and nickel-plated carbon nanofibers, which correspond to a resultant product in step (a), and the nonwoven fabric strength reinforcing agent.

According to still another example of the present invention, for the improvement of effectiveness for electromagnetic wave shield, the mixing in step (b) is performed by further adding: as a magnetic or ferromagnetic additive, one metal or an alloy of two or more metals selected from the group consisting of iron, nickel, and cobalt; and, as a carbon-based additive, an additive selected from the group consisting of carbon nanotubes, graphite, carbon block or metal-plated carbon-based additives thereof, ferrites, and inorganic-based additives.

(c) Adding and Dispersing Resultant Product in Step (b) in Water

Then, the method of the present invention includes step (c) of adding 3-30% (w/v) to the resultant product in step (b) to water, followed by dispersing.

According to another example of the present invention, the water in step (c) is water that is contained in a sheet former machine used in the manufacturing of a nonwoven fabric.

According to still another example of the present invention, 3-20% (w/v), more preferably 3-10% (w/v), and still more preferably 5-9% (w/v) of the resultant product in step (b) is added and dispersed in water.

According to still another example of the present invention, in order to enhance the adhesive strength of the fibers or the strength of the nonwoven fabric at the time of manufacturing the nonwoven fabric, in step (c), a water-soluble adhesive or a water-soluble polymer is further added in 0.1-50 wt % on the basis of the total weight of the resultant product in step (c).

For the water-soluble adhesive used in the present invention, various water-soluble adhesives known in the art may be used without particular limitations.

The water-soluble polymer used in the present invention may be used to enhance the strength of the nonwoven fabric and to improve the process efficiency at the time of manufacturing the nonwoven fabric, and for such purposes, various water-soluble polymers known in the art may be used: preferably, the water-soluble polymer is polyvinylalcohol (PVA) or polyvinylacetate (PVAc).

According to still another example of the present invention, the water-soluble adhesive or the water-soluble polymer may be added and dispersed in 0.1-10 wt % on the basis of the total weight of the resultant product in step (c). More preferably, the water-soluble polymer may be added and dispersed in 0.1-3 wt %, still more preferably 0.1-2 wt %, and most preferably 1.5 wt %, on the basis of the total weight of the resultant product in step (c). Meanwhile, the kind and content of the water-soluble polymer may be adopted considering a change in the strength of the nonwoven fabric.

(d) Filtering Resultant Product in Step (c) to Remove Water

Last, the present invention includes step (d) of filtering the resultant product in step (c) to remove water.

The removal of water through the filtering is carried out through a mesh net, thereby manufacturing a nonwoven fabric for shielding and absorbing electromagnetic waves using metal (copper and nickel)-plated carbon fibers.

According to another example of the present invention, the method includes, step (e) of, after step (d), immersing the nonwoven fabric, which is a resultant product in step (d), in a mixture solution (dilute solution) in which a thermoplastic resin is dissolved in a solvent selected from the group consisting of toluene, acetone, alcohol, tetrahydrofurane (THF), cyclohexane, and xylene, the content of the thermoplastic resin being 0.1-10 wt % on the basis of the total weight of the solvent, or spraying the mixture solution (dilute solution) on the nonwoven fabric, which is a resultant product in step (d).

The reason that the method further includes step (e) is that, when the nonwoven fabric is manufactured using only the metal (copper and nickel)-plated carbon fibers, the adhesive strength between the fibers is weak, so the nonwoven fabric cannot satisfy desired physical characteristics, and thus, step (e) is performed as a post-treatment process in order to impart stronger physical properties to the nonwoven fabric.

For the thermoplastic resin, various thermoplastic resins known in the art may be used, and preferably, polystyrene (PC) may be used.

According to still another example of the present invention, the mixture solution (dilute solution) in step (e) is prepared by dissolving a thermoplastic resin in 0.1-5 wt %, more preferably 1-2 wt %, and most preferably 1.5 wt %, on the basis of the total weight of the solvent.

In the immersing in step (e), the nonwoven fabric, which is a resultant product in step (d), is immersed in the mixture solution (dilute solution) for preferably 1-60 seconds, more preferably 5-30 seconds, still more preferably 7-15 seconds, and most preferably 10 seconds.

According to another example of the present invention, the method further includes, step (f) of drying the resultant product in step (d) or (e) at 50-150° C. for 10 minutes to 3 hours.

In cases where the nonwoven fabric is a resultant product in step (d), which is manufactured according to the method of the present invention by using only the metal-plated carbon fibers without adding the natural pulp or low-melting thermoplastic resin as a strength reinforcing agent, such a nonwoven fabric is dried, preferably, at 50-100° C. for 1-3 hours, more preferably at 60-80° C. for 1.5-2.5 hours, and most preferably at 70° C. for 2 hours.

When the nonwoven fabric is a resultant product in step (d), which is manufactured according to the method of the present invention by adding the low-melting thermoplastic resin as a strength reinforcing agent, such a nonwoven fabric is dried, preferably, at 100-150° C. for 10 minutes to 1 hour, more preferably at 110-130° C. for 20-40 minutes, and most preferably at 120° C. for 30 minutes.

The reason that the drying is performed within the above temperature range in cases where the low-melting thermoplastic resin is added is that the surface of the low-melting thermoplastic resin, preferably, LMPET, is melted at 100° C. or higher to exhibit an adhesive effect with respect to highly conductive, metal-plated carbon fibers.

In cases where the low-melting thermoplastic resin is added, in order to obtain more stable strength and smoothness, the method of the present invention further includes a step of performing pressing using a hot press at 140-160° C. for 3-10 seconds, and most preferably at 150° C. for 7 seconds.

When the nonwoven fabric is a resultant product in step (d), which is manufactured according to the method of the present invention by adding a water-soluble polymer (preferably, polyvinyl alcohol (PVA) or polyvinyl acetate (PVAc)) used to enhance the strength of the nonwoven fabric and improve the process efficiency at the time of manufacturing a nonwoven fabric, such a nonwoven fabric is dried, preferably, at 50-100° C. for 30 minutes to 2 hours, more preferably at 60-80° C. for 40 minutes to 1.5 hours, and most preferably at 70° C. for 1 hour.

When the nonwoven fabric is a resultant product in step (e), such a nonwoven fabric is dried, preferably, at 50-100° C. for 10-50 minutes, more preferably at 60-80° C. for 10-30 minutes, and most preferably at 70° C. for 10 minutes.

Meanwhile, although not used in the examples of the present invention, SMC, BMC, autoclave, prepreg, or the like may be employed in the molding of normal nonwoven fabrics or woven fibrous textures. As for an effective method employing the prepreg, the conductive nonwoven fabric (web) is impregnated with epoxy, and primarily dried (semi-cured) at 70° C. for 8 hours, and the prepared prepreg is pressed and cured at 150° C. using a hot press. Besides the prepreg, within the normal knowledge range, the conductive nonwoven fabric (web) may be impregnated with a thermally curable resin (phenol resin, unsaturated polyester resin, urethane resin, melamine resin), thermally cured, and made into sheets.

One of the main features of the present invention is that the nonwoven fabric for Shielding and absorbing electromagnetic waves manufactured by the method of the present invention contains copper and nickel-plated carbon fibers obtained by continuous electroless and electrolytic processes, and thus has further improved effects of shielding and absorbing electromagnetic waves compared with a plastic composite material as a comparative example below.

The copper and nickel-plated carbon fibers used in the present invention are highly conductive carbon fibers with excellent electrical conductivity prepared by continuous electroless and electrolytic processes, which have been developed by the present inventors, and are prepared by the following method.

Specifically, the copper and nickel-plated carbon fibers obtained by continuous electroless and electrolytic processes, the carbon fibers being used in the method of the present invention, are prepared by the method including the following steps: (a) allowing carbon fibers to pass through an electroless plating solution to plate the carbon fibers with copper for 6-10 minutes, the electroless plating solution containing, on the basis of the volume of pure water, 2.5-5.5 g/l Cu ions, 20-55 g/l EDTA, 2.5-4.5 g/l formalin, 2-6 g/l triethanolamine (TEA), 25% 8-12 ml/l NaOH, and 0.008-0.15 g/l 2,2'-bipiridine, at pH 12-13 and a temperature of 36-45° C.; and (b) allowing the copper-plated carbon fibers in step (a) to pass through an electrolytic plating solution to plate the copper-plated carbon fibers with nickel for 1-3 minutes, the electrolytic plating solution containing 280-320 g/l Ni(NH$_2$SO$_3$)$_2$, 15-25 g/l NiCl$_2$, and 35-45 g/l H$_3$BO$_3$, at pH 4.0-4.2 and a temperature of 50-60° C.

Hereinafter, the method of the present invention for preparing metal-plated carbon fibers obtained by continuous electroless and electrolytic processes will be described by the steps as below:

(a) Electroless Plating Process

First, the method of the present invention includes a step of electroless plating carbon fibers with a metal.

In one Example, in cases where the carbon fibers are plated with copper, an electroless plating solution contains pure water, a copper metal salt, a complexing agent, a reducing agent, a stabilizer, and a pH adjusting agent.

The copper metal salt contained in the electroless plating solution supplies copper ions for imparting conductivity to the carbon fibers. Formalin as a reducing agent, EDTA as a complexing agent, triethanolamine (TEA) and 2.2'-bipiridine as a stabilizer, and 25% NaOH as a pH adjusting agent were used.

As can be confirmed in examples, as the contents of formalin as a reducing agent and NaOH as a pH adjusting agent, which are contained in the electroless plating solution, were increased, the plating rate was increased, but the lifespan of the plating solution was shortened, and thus, the contents of the reducing agent and the pH adjusting agent were adopted by considering this matter.

Meanwhile, as can be clearly confirmed from examples, as a result of testing the plating rate and the stability of solution by adjusting the content of the reducing agent while the contents of the copper ions and the complexing agent increase at the same ratio, the plating rate and the thickness of the plating layer can be controlled by adjusting the concentrations of copper ions and formalin as a reducing agent, and through the control of the thickness of the plating layer, the specific gravity, strength, elastic modulus, and strain can be controlled. However, as the plating layer is thicker, the specific gravity is increased, and the strength, elastic modulus, and strain deteriorate, and thus the present invention solved the above problems by performing electrolytic plating together with the adjustment of the concentrations of the copper ions and formalin as a reducing agent, thereby improving conductivity through a thin thickness. This is why the present invention adopts continuous electroless and electrolytic processes.

According to another example of the present invention, the electroless plating step in step (a) is characterized by allowing carbon fibers to pass through an electroless plating solution to plate the carbon fibers with copper for 6-10 minutes, the electroless plating solution containing, on the basis of the volume of pure water, 2.5-3.5 g/l Cu ions, 25-35 g/l EDTA, 2.5-3.5 g/l formalin, 2-3 g/l triethanolamine (TEA), 8-12 ml/l 25% NaOH, and 0.008-0.01 g/l 2,2'-bipiridine, at pH 12-13 and a temperature of 36-40° C.

According to still another example of the present invention, the electroless plating step in step (a) is characterized by allowing carbon fibers to pass through an electroless plating solution to plate the carbon fibers with copper for 6-10 minutes, the electroless plating solution containing, on the basis of the volume of pure water, 2.5-3.5 g/l Cu ions, 20-30 g/l EDTA, 2.5-3.5 g/l formalin, 2-3 g/l triethanolamine (TEA), 8-12 ml/l 25% NaOH, and 0.008-0.01 g/l 2,2'-bipiridine, at pH 12-13 and a temperature of 36-40° C.

According to another example of the present invention, the electroless plating step in step (a) is characterized by allowing carbon fibers to pass through an electroless plating solution to plate the carbon fibers with copper for 6-10 minutes, the electroless plating solution containing, on the basis of the volume of pure water, 4.5-5.5 g/l Cu ions, 30-40 g/l EDTA, 2.5-3.5 g/l formalin, 4-6 g/l triethanolamine (TEA), 8-12 ml/l 25% NaOH, and 0.01-0.15 g/l 2,2'-bipiridine, at pH 12-13 and a temperature of 40-45° C.

According to high-rate plating in still another example of the present invention, the electroless plating in step (a) is characterized by allowing carbon fibers to pass through an electroless plating solution to plate the carbon fibers with copper for 6-10 minutes, the electroless plating solution containing, on the basis of the volume of pure water, 4.5-5.5 g/l Cu ions, 45-55 g/l EDTA, 3.5-4.5 g/l formalin, 4-6 g/l triethanolamine (TEA), 8-12 ml/l 25% NaOH, and 0.01-0.15 g/l 2,2'-bipiridine, at pH 12-13 and a temperature of 40-45° C.

After the electroless plating, three stages of washing were performed, and the third washing in the three stages of washing was performed by adding 1-2% $H_2SO_4$. This is for keeping the pH of an electrolytic plating bath and activating surfaces of the electroless-plated carbon fibers.

(b) Electrolytic Plating Process

Next, the method of the present invention includes a step of, after the carbon fibers are plated with copper by the electroless plating process, continuously plating the carbon fibers with nickel by an electrolytic plating process.

One of the characteristics of the present invention is that the electrical conductivity of the carbon fibers was improved by carrying out an electroless plating process and then carrying out a nickel electrolytic plating process.

An electrolytic plating solution for conducting the electrolytic plating process employs $Ni(NH_2SO_3)_2$ and $NiCl_2$, as nickel metal salts, and $H_3BO_3$, as a pH buffer.

As can be clearly confirmed from examples, the carbon fibers obtained by continuous electroless and electrolytic processes had an electric resistance value, which was reduced by about 32- to 37-fold compared with non-plated carbon fibers, and reduced by 2-fold compared with the comparative example, thereby improving electrical conductivity.

It is determined that copper pores were filled by quickly carrying out the Ni electrolytic plating, after the electroless plating, and as a result, the electrical conductivity was improved.

According to another example of the present invention, the electrolytic plating process in step (b) is carried out by applying a constant voltage (CV) of 5-15 V.

In cases of the continuous electroless copper plating and electrolytic nickel plating processes, the electrolytic plating process is carried out by applying a constant voltage (CV) of 5-10 V, and more preferably 6-8 V.

The advantage of the electroless and electrolytic plating processes is that an alloy layer is formed that exhibits excellent electrical conductivity, is effective in adhesive strength and flexibility, has a thin thickness due to an electrolytic metal material adhering to spaces of the metal, which are generated in the electroless plating, and retains excellent conductivity. In addition, the carbon fibers can be uniformly plated by the electroless plating and electrolytic plating processes.

Electroless (copper) plating is first carried out, and then, electrolytic plating was continuously carried out. A voltage is applied to a bath in which carbon fibers are placed, so that electrolyte ions are combined with pores generated from the electroless plating, thereby producing a product with a small plating thickness and improved conductivity.

According to still another example of the present invention, the carbon fibers in step (a) are pre-treated by the method including the following steps: (i) allowing carbon fibers to pass through an aqueous solution containing a surfactant, an organic solvent, and a non-ionic surfactant, to degrease and soften the carbon fibers; (ii) allowing the carbon fibers, which correspond to a resultant product in step (i), to pass through an aqueous solution containing sodium bisulfate ($NaHSO_3$), sulfuric acid ($H_2SO_4$), ammonium persulfate ($(NH_4)_2S_2O_8$), and pure water, to perform an etching process that functions as neutralizing, washing, and conditioning actions; (iii) allowing the carbon fibers, which correspond to a resultant product in step (ii), to pass through an aqueous solution of $PdCl_2$ to perform a sensitizing process; and (iv) allowing the carbon fibers, which correspond to a resultant product in step (iii), to pass through an aqueous solution of sulfuric acid ($H_2SO_4$) to perform an activating process.

(i) Degreasing and Softening Carbon Fibers

In the method of the present invention, for the pretreatment of the carbon fibers, first, the carbon fibers are degreased and softened by passing through an aqueous solution containing a surfactant, an organic solvent, and a non-ionic surfactant.

The aqueous solution containing a surfactant, an organic solvent, and a non-ionic surfactant functions as a degreasing action of removing epoxy or urethane that has been sized on the carbon fibers, and at the same time, as an action of softening surfaces of the fibers through swelling.

According to still another example of the present invention, the aqueous solution in step (i) contains 15-35 wt % of a solution, as a surfactant, in which pure water and NaOH are mixed at a weight ratio of 40-49:1-10, 50-80 wt % of diethyl propanediol and 5-15 wt % of dipropylene glycol methyl ether as organic solvents, and a non-ionic surfactant with 400-600 ppm, and more preferably, contains 20-30 wt % of a solution, as a surfactant, in which pure water and NaOH are mixed at a weight ratio of 45-48:2-5, 58-72 wt % of diethyl propanediol and 8-12 wt % of dipropylene glycol methyl ether as organic solvents, and a non-ionic surfactant with 400-600 ppm.

The non-ionic surfactant includes various non-ionic surfactants known in the art, but the non-ionic surfactant is preferably ethoxylated linear alcohol, ethoxylated linear alkyl-phenol, or ethoxylated linear thiol, and more preferably, ethoxylated linear alcohol.

According to still another preferable example of the present invention, step (i) was performed at a temperature of 40-60° C. for 1-5 minutes, and more preferably at a temperature of 45-55° C. for 1-3 minutes.

(ii) Etching Process

Then, for the pretreatment of the carbon fibers, an etching process is performed that neutralizes strong alkali components, helps a washing process for a next process, a sensitizing process, and performs a conditioning action.

An aqueous solution for the etching process contains sodium bisulfate ($NaHSO_3$), sulfuric acid ($H_2SO_4$), ammonium persulfate ($(NH_4)_2S_2O_8$), and pure water.

The aqueous solution in step (ii) contains, more preferably, 0.1-10 wt % of sodium bisulfate ($NaHSO_3$), 0.1-3 wt % of sulfuric acid ($H_2SO_4$), 5-25 wt % of ammonium persulfate ($(NH_4)_2S_2O_8$), and 62-94.8 wt % of pure water, and still more preferably, 0.8-2 wt % of sodium bisulfite; $NaHSO_3$, 0.3-1 wt % of sulfuric acid ($H_2SO_4$), 10-20 wt % of ammonium persulfate ($(NH_4)_2S_2O_8$), and 77-88.9 wt % of pure water.

According to still another preferable example of the present invention, step (ii) is performed at a temperature of 20-25° C. for 1-5 minutes, and more preferably at a temperature of 20-25° C. for 1-3 minutes.

(iii) Sensitizing Process

Then, a sensitizing process is performed by allowing the carbon fibers, which correspond to a resultant product in step (ii), to pass through an aqueous solution of $PdCl_2$.

The sensitizing process is for allowing metal ions to be adsorbed on the surfaces of the surface-modified carbon fibers.

The concentration of the aqueous solution of $PdCl_2$ is more preferably 10-30%, and still more preferably 15-25%.

According to still another example of the present invention, step (iii) was performed at a temperature of 20-40° C. for 1-5 minutes, and more preferably at a temperature of 25-35° C. for 1-3 minutes.

(iv) Activating Process

Then, for the pretreatment of the carbon fibers, an activating process is performed by allowing the carbon fibers, which correspond to a resultant product in step (iii), to pass through an aqueous solution of sulfuric acid ($H_2SO_4$).

Herein, the activating process may be performed after the sensitizing process in the present description, but the performing of the activating process together with the sensitizing process is included within the scope of the present invention.

The activating process is performed in order to remove colloidized Sn, for the prevention of Pd oxidation.

More preferably, the concentration of the aqueous solution of sulfuric acid ($H_2SO_4$) is 5-15%.

According to still another preferable example of the present invention, step (iv) is performed at a temperature of 40-60° C. for 1-5 minutes, and more preferably at a temperature of 45-55° C. for 1-3 minutes.

The carbon fibers may be pre-treated by the above-described methods, and the pre-treated carbon fibers may be plated with metals, copper and nickel, by continuous electroless and electrolytic processes.

In accordance with another aspect of the present invention, there is provided a nonwoven fabric for shielding and absorbing electromagnetic waves, manufactured by the above-described method of the present invention.

The nonwoven fabric of the present invention for shielding and absorbing electromagnetic waves is prepared by the above-described method for manufacturing a nonwoven fabric for shielding and absorbing electromagnetic waves of the present invention, and thus the overlapping descriptions therebetween are omitted to avoid excessive complication of the specification due to repetitive descriptions thereof.

In accordance with still another aspect of the present invention, there is provided a nonwoven composite material for shielding and absorbing electromagnetic waves, the nonwoven composite material including: (i) the above-described nonwoven fabric of the present invention as a core; (ii) a finish film laminated on one surface of the nonwoven fabric as a core in step (i); and (ii) a finish film laminated on the other surface of the nonwoven fabric as a core in step (i).

In accordance with still another aspect of the present invention, there is provided a nonwoven composite material for shielding and absorbing electromagnetic waves, the nonwoven composite material including: (i) the above-described nonwoven fabric of the present invention as a core; (ii) a finish film laminated on one surface of the nonwoven fabric as a core in step (i); and (ii) a double-sided adhesive film laminated on the other surface of the nonwoven fabric as a core in step (i).

The nonwoven composite material for shielding and absorbing electromagnetic waves of the present invention employs the above-described nonwoven fabric as a core, and thus the descriptions of overlapping contents therebetween are omitted to avoid excessive complexity of the specification due to repetitive descriptions thereof.

According to an example of the present invention, the nonwoven composite material of the present invention may have a film type or a sticker type.

The film type nonwoven composite material of the present invention has a three-layer structure in which finish films are laminated on both surfaces of the above-described nonwoven fabric of the present invention as a core.

Meanwhile, the sticker type nonwoven composite material of the present invention has a three-layer structure in which (i) a finish film is laminated on one surface of (ii) the above-described nonwoven fabric of the present invention as a core and (iii) a double-sided adhesive film is laminated on the other surface of the nonwoven fabric.

As the finish film used in the nonwoven composite material (film or sticker) of the present invention, various thermoplastic resin films known in the art may be used, and preferably, a polyethylene terephthalate (PET) film may be used.

A decoration film, of which an external surface is printed with a design, may be used as the finish film of the present invention. The printing of the design may be carried out by various methods known in the art, and preferably, the design is printed using UV printing.

According to another example of the present invention, the film type nonwoven composite material of the present invention is prepared by: laying hot-melt films between (i) the nonwoven fabric and (ii) the finish film and between (i) the nonwoven film and (iii) the finish film, respectively, followed by pressing using a hot press, to bind the nonwoven fabric and the finish films; or coating an adhesive therebetween to laminate the nonwoven fabric and the finish films, the adhesive being selected from the group consisting of an aqueous adhesive, a solvent-based adhesive, a urethane adhesive, an epoxy adhesive, an unsaturated polyester-based adhesive, and a resol type phenol adhesive.

According to still another example to the present invention, the sticker type nonwoven composite material of the present invention is prepared by: laying a hot-melt film between (i) the nonwoven fabric and (ii) the finish film, followed by pressing using a hot press, to bind the nonwoven fabric and the finish film; or coating an adhesive therebetween to laminate the nonwoven fabric and the finish film, the adhesive being selected from the group consisting of an aqueous adhesive, a solvent-based adhesive, a urethane adhesive, an epoxy adhesive, an unsaturated polyester-based adhesive, and a resol type phenol adhesive.

According to still another example of the present invention, the binding process is carried out by pressing using a hot press at 80-120° C. for 5-20 seconds, and more preferably, the binding process is carried out at by pressing using a hot press 90-110° C. for 8-12 seconds.

According to still another example of the present invention, the adhesive further includes: as an additive for enhancing effectiveness of shielding and absorbing electromagnetic waves, (a) a powder of at least one metal selected from the group consisting of aluminum, iron, chrome, stainless steel, copper, nickel, black nickel, silver, gold, platinum, palladium, tin, cobalt, and an alloy of at least two thereof; or (b) a carbon-based adhesive selected from the group consisting of carbon nanotubes, graphite, carbon black, and a metal-plated additive thereof.

As described above, the above-described conductive nonwoven fabric of the present invention has sufficient conductivity and strength, and thus a nonwoven composite material (film or sticker) for shielding and absorbing electromagnetic waves was prepared by using a film formed of a thermoplastic resin and applying a binding or laminating process in consideration of economical feasibility and productivity.

The nonwoven composite material (film or sticker) for shielding and absorbing electromagnetic waves using the conductive nonwoven fabric composed of metal (copper and nickel)-plated carbon fibers of the present invention can be used to block electromagnetic waves by being inserted into a cellular phone cover or a cellular phone pouch, applied to an LCD protective bracket for a portable display product, and used in an internal housing of an electric vehicle. Furthermore, the laminating film composite material finished with upper and lower films or a double-sided tape can be used as a sticker for blocking electromagnetic waves.

Effects of the Invention

Features and advantages of the present invention are summarized as follows:

(a) The present invention provides: a nonwoven fabric for shielding and absorbing electromagnetic waves manufactured by using metal (copper and nickel)-plated carbon fibers prepared through continuous electroless and electrolytic processes; and a nonwoven composite material containing the same.

(b) The nonwoven fabric of the present invention is thinner and stronger than that of the conventional art, and the conductivity of the nonwoven fabric of the present invention can be controlled by adjusting only the content of metal-plated carbon fibers without adding an additional conductive powder.

(c) Furthermore, the nonwoven fabric of the present invention per se has an excellent performance of electromagnetic waves shield, and thus has an economical advantage in that nonwoven composite materials (film or sticker) for shielding and absorbing electromagnetic waves can be simply mass-produced by an upper/lower binding process or a laminating process.

DETAILS FOR CARRYING OUT THE INVENTION

Figure 1:
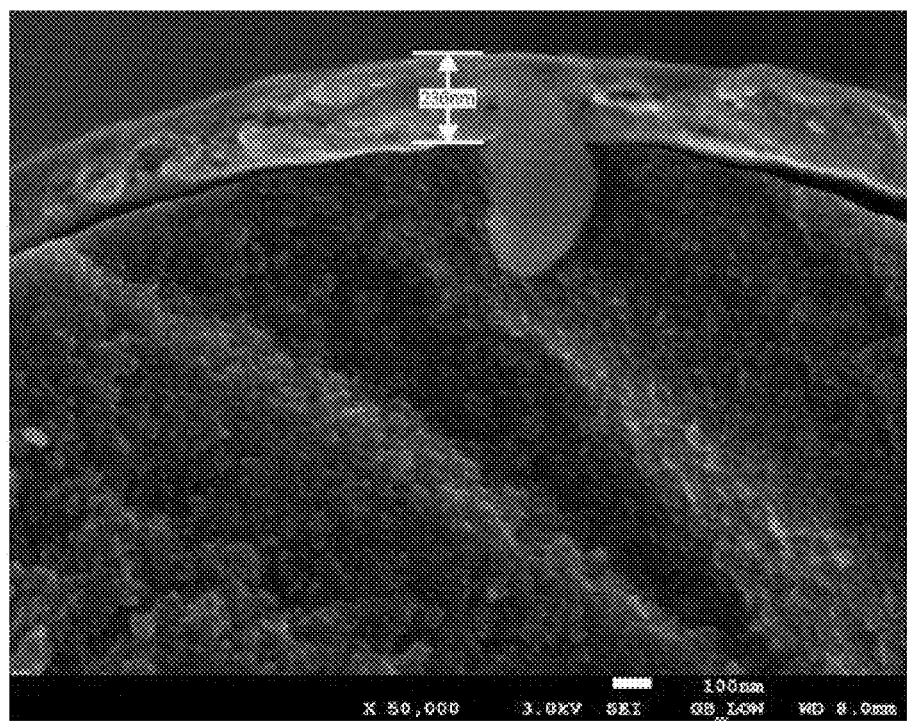
FIG. 1 is an enlarged cross-sectional image of metal-plated carbon fibers manufactured by continuous electroless and electrolytic processes.
Figure 2:
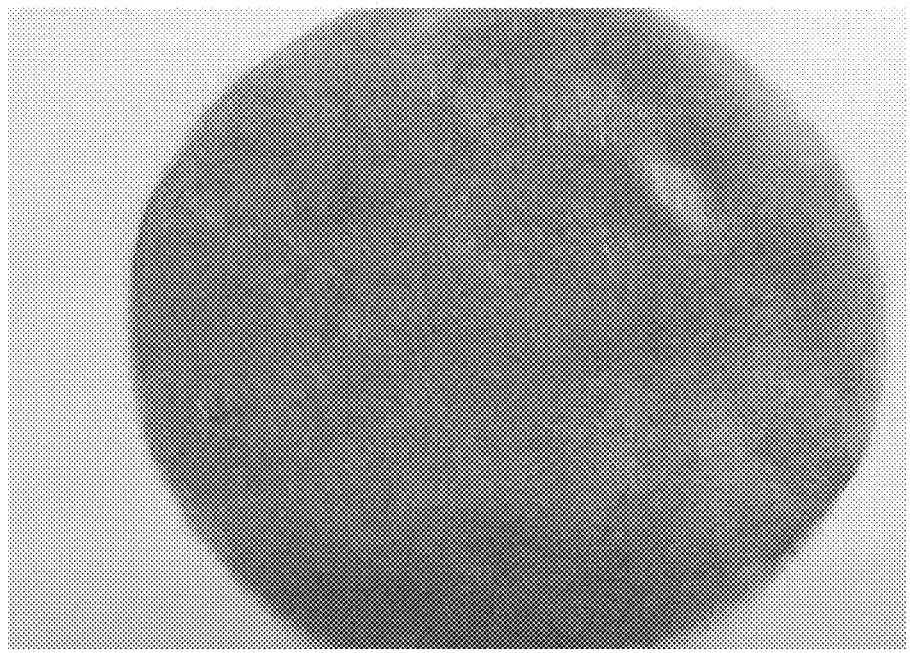
FIG. 2 is an image showing a nonwoven fabric (wet laid) manufactured using metal-plated carbon fibers according to an example of the present invention.
Figure 3:
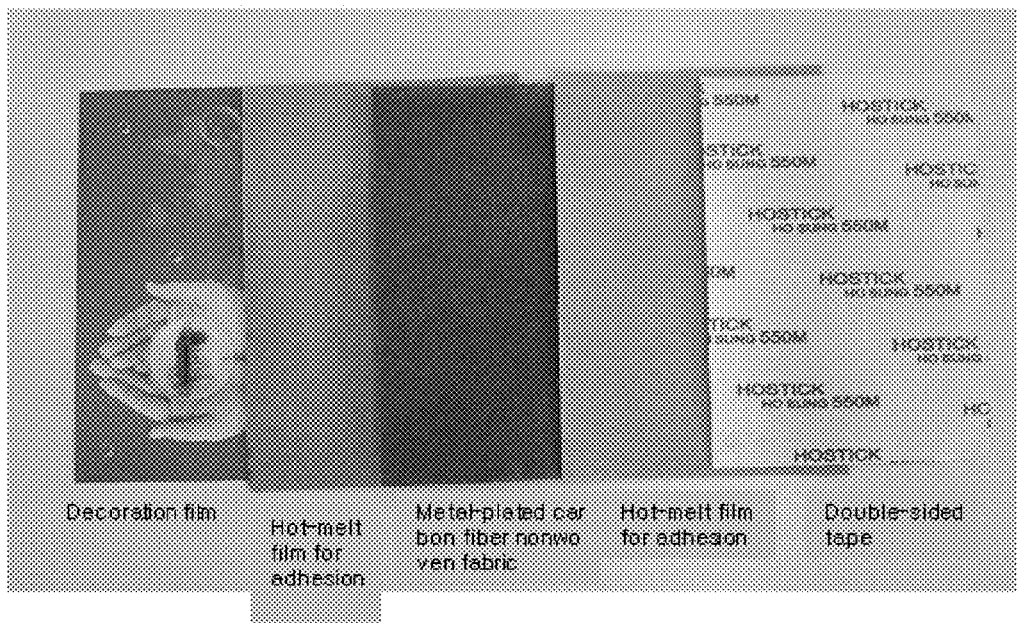
FIG. 3 shows a diagram for manufacturing a sticker type of nonwoven composite material for shielding and absorption of electromagnetic waves according to another example of the present invention.
Figure 4:
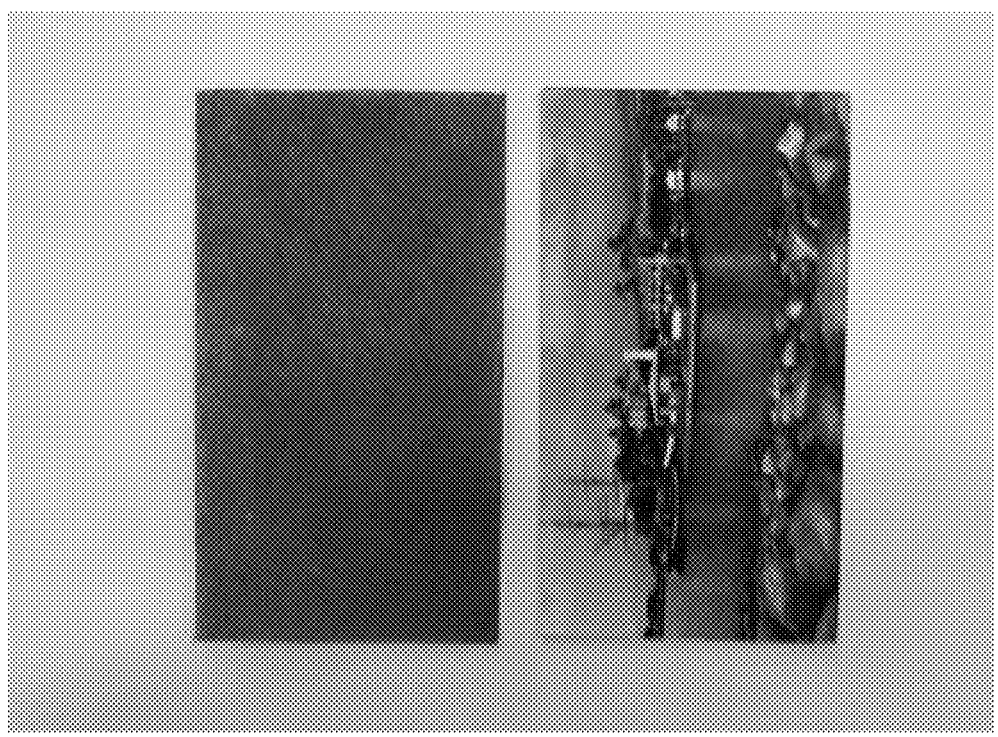
FIG. 4 is an image showing a metal-plated carbon fiber nonwoven fabric manufactured according to an example of the present invention, and a decoration film.
Figure 5:
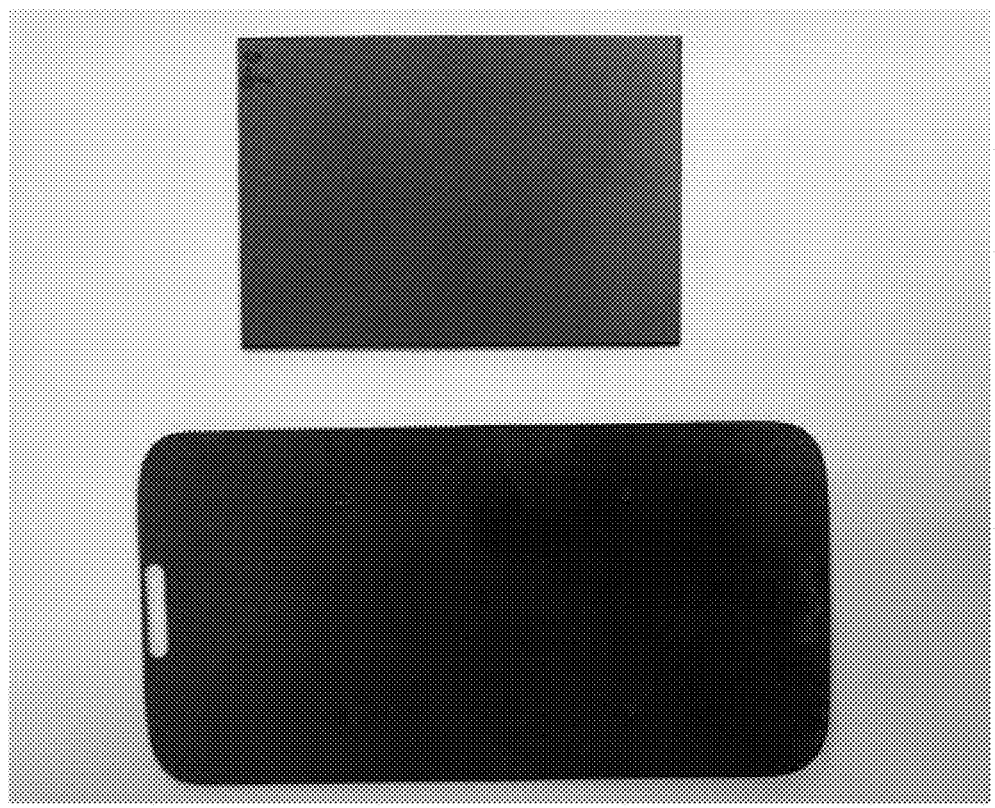
FIG. 5 is an image of test samples for comparison between a metal-plated carbon fiber nonwoven fabric manufactured according to an example of the present invention and an injected or extruded material containing fibers for electromagnetic waves shield.
Figure 6:
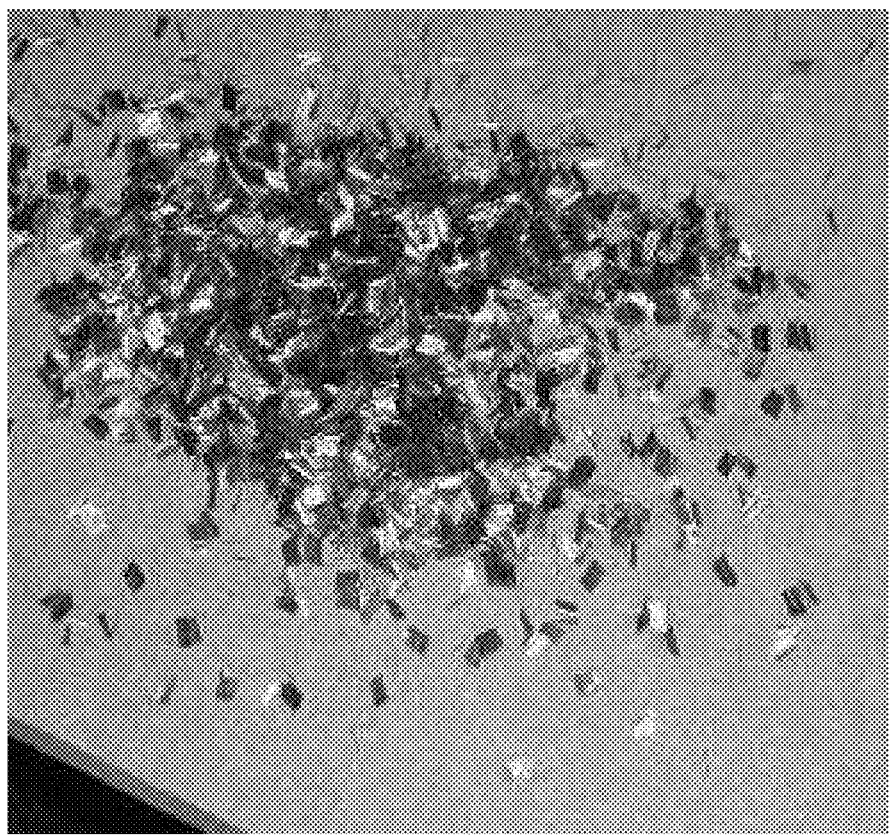
FIG. 6 is an image of a chopped sample resulting from the cutting of the metal-plated carbon fibers used in the present invention.
Figure 7:
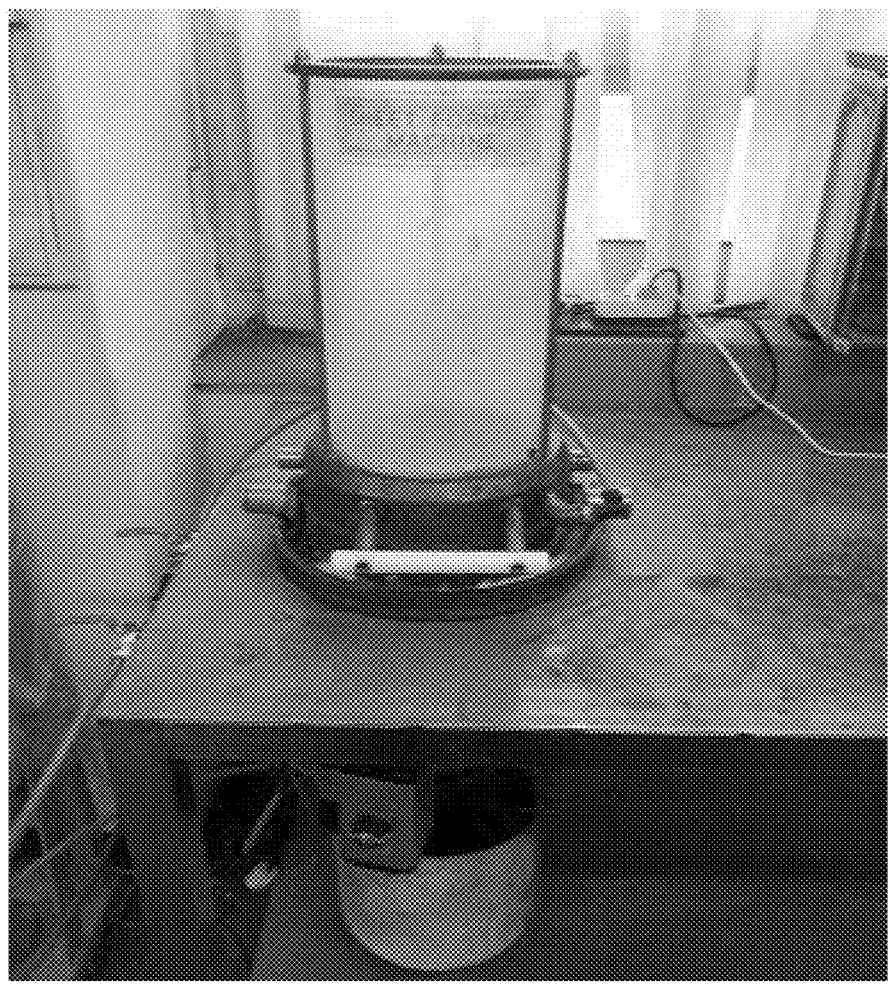
FIG. 7 is an image of a nonwoven fabric manufacturing machine for manufacturing an experimental nonwoven fabric (wet laid).

Hereinafter, the present invention will be described in detail with reference to examples. These examples are only for illustrating the present invention more specifically, and it will be apparent to those skilled in the art that the scope of the present invention is not limited by these examples.

Throughout the present specification, the term "%" used to express the concentration of a specific material, unless otherwise particularly stated, refers to (wt/wt) % for solid/solid, (wt/vol) % for solid/liquid, and (vol/vol) % for liquid/liquid.

EXAMPLES

Example 1

Manufacturing of Copper and Nickel-plated Carbon Fiber Nonwoven Fabric by Continuous Electroless and Electrolytic Processes Metal (copper and nickel)-plated carbon fibers prepared by continuous electroless and electrolytic processes were cut into 3 mm, 6 mm, or 12 mm, and each 1 g of metal-plated carbon fibers, which were processed in a chopped form, were dispersed in 500 g of water, followed by high-speed dispersion at 5,000 rpm for 1 minute in a mixer. The mixture solution having the metal-plated carbon fibers dispersed therein was put in a sheet former machine (self-production) filled with 7 L of water, and, after 3 seconds, the water was discharged through a mesh net to obtain a remaining carbon fiber nonwoven fabric. The carbon fiber nonwoven fabric filtered on the mesh net was dried in an oven at 70° C. for 2 hours. Finally, it obtains a metal-plated carbon fiber nonwoven fabric having a weight of 30 g/m$^2$.

For the metal-plated fibers used in example 1 and examples 2 to 5 below, Cu—Ni double-plated carbon fibers, which were prepared through continuous electroless and electrolytic processes by Bullsone Material CO. Ltd., were used, and the carbon fibers were chopped into 3 mm, 6 mm, or 12 mm.

Example 2

Manufacturing of LMPET-added Composite Nonwoven Fabric for Strength Reinforcement For strength reinforcement, 0.1 g, 0.2 g, or 0.3 g of low-melting polyethylene terephthalate (LMPET) was added to chopped metal (copper and nickel)-plated carbon fibers, thereby manufacturing a composite nonwoven fabric for strength reinforcement, to which LMPET was added in 10 wt %, 20 wt %, or 30 wt % on the basis of the total weight of the metal-plated carbon fibers and LMPET. The composite nonwoven fabric containing 10 wt % of LMPET was manufactured by dispersing 0.9 g of the metal-plated carbon fibers and 0.1 g of LMPET in 500 g of water, carrying out high-speed dispersion at 5,000 rpm for 1 minute in a mixer, putting the mixture solution in a sheet former machine (self-production) filled with 7 L of water, and, after 3 seconds, discharging the water through a mesh net, thereby obtaining a remaining carbon fiber nonwoven fabric. In the same manner, the composite nonwoven fabric containing 20 wt % of LMPET was manufactured by using 0.8 g of the metal-plated carbon fibers and 0.2 g of LMPET, and the composite nonwoven fabric containing 30 wt % of LMPET was manufactured by using 0.7 g of the metal-plated carbon fibers and 0.3 g of LMPET. The carbon fiber nonwoven fabric filtered on the mesh net was dried in an oven at 120° C. for 2 hours to obtain a metal-plated carbon fiber nonwoven fabric. The obtained nonwoven fabric was pressed in a hot press at 150° C. for 7 seconds. Finally, it obtains a final product with 30 g/m$^2$.

Example 3

Manufacturing of Metal-plated Carbon Fiber Nonwoven Fabrics of 60 g/m² and 90 g/m²

The method described in examples 1 and 2 was used to obtain samples with a basis weight of 30 g/m². Because the effectiveness of electromagnetic wave shield may vary depending on the content of the metal-plated carbon fibers, nonwoven fabrics with 60 g/m² and 90 g/m² were manufactured in order to measure the efficiency of electromagnetic waves shield depending on the content. The nonwoven fabrics with 60 g/m² and 90 g/m² were manufactured by the same method as in example 1 except that the total weight of the fibers was 2 g and 4.5 g for the respective fabrics.

Example 4

Manufacturing of Nonwoven Composite Material Using Metal-plated Carbon Fiber Nonwoven Fabric Hot-melt films were laid on both surfaces of each of the nonwoven fabrics with 30 g/m², 60 g/m² and 90 g/m², and upper and lower surfaces thereof were finished with UV-printed PET films. The binding process was carried out by press-molding using a hot press at 100° C. for 10 seconds.

As an adhesive film used in example 4 and examples 5 and 6, a hot-melt type adhesive film was used in order to allow the metal-plated carbon fiber nonwoven fabric and the PET decoration film to adhere to each other. Meanwhile, the adhering manner may employ normal adhesives without limitation to the hot-melt type adhesive film.

In addition, The UV-printed PET film, as a decoration film used in example 4 and examples 5 and 6, used SW84G product of SKC company, printed with a design through UV printing, but the printing of the design was not particularly limited to UV printing.

Example 5

Manufacturing of Nonwoven Composite Material Using LMPET-added Composite Nonwoven Fabric for Strength Reinforcement Hot-melt films were laid on both surfaces of the nonwoven fabric containing 10 wt %, 20 wt %, or 30 wt % of LMPET, and upper and lower surfaces thereof were finished with UV-printed PET films. The binding process was carried out by press-molding using a hot press at 100° C. for 10 seconds.

Example 6

Manufacturing of Sticker Using Nonwoven Composite Material

Hot-melt films were laid on both surfaces of the metal (copper and nickel)-plated carbon fiber nonwoven fabric of examples 1 and 3, or the LMPET-added composite nonwoven fabric for strength reinforcement of example 2, and an upper surface thereof was finished with a UV-printed PET film, and a double-sided tape with a release film was laid on a lower surface thereof, followed by binding. The binding process was carried out by press-molding using a hot press at 100° C. for 10 seconds. The obtained sample was conveniently attachable, like a sticker, through the removal of the release film.

Comparative Example 1

Manufacturing of Composite Material for Electromagnetic Waves Shield

For the comparative example, composite materials for electromagnetic waves shield were manufactured by injection-molding PP(Polypropylene) as a thermoplastic resin and copper/nickel-plated carbon fibers. The contents thereof are shown in table 1 below. Injection-molded products were manufactured in sheet forms with thicknesses of 0.5 mm and 0.7 mm. Specifically, polypropylene (PP, grade BJ 700, melting index: 25, density: 0.91 g/cm³, heat deflection temperature: 105° C., Samsung Total) was dried in a vacuum oven at 80° C. for 6 hours, and then 80 wt % of the dried PP was mixed with 20 wt % of copper and nickel-plated carbon fibers (6 mm). In addition, the mixture was fed into an extruder (twin injection machine; manufactured by Woojin, Korea, GT-1 9300), and injected through a mold with a standard specified by ASTM D4935. In this case, the temperature section was divided into five, which was set to 215° C., 220° C., 220° C., 220° C., and 230° C., respectively, and a molding operation was conducted under 55 rpm, 60 bars, and a mold cooling time of 8 seconds.

Test Example 1

Test on Electromagnetic Waves Specific Shielding Rate and Absorbing Rate (Specific Absorption Test, SAR)

The nonwoven fabrics of examples 1 to 3 and the plastic composite materials of the comparative example were subjected to a specific absorption rate (SAR) test, and the results are shown in table 1 below.

TABLE 1

A Test on attenuation of Electromagnetic waves in cellular phone

| Item | | Thickness | SAR result value (reduction (%)) | Efficiency of Electromagnetic wave shield (ASTM D4935) EMI SE(dB) (at 1.0 GHz) |
|---|---|---|---|---|
| Example 1 (nonwoven fabric 30 g/m²) | | 0.18 mm | 84 | 65 |
| Example 3 | nonwoven fabric 60 g/m² | 0.35 mm | 91 | 67 |
| | nonwoven fabric 90 g/m² | 0.51 mm | 95 | 68 |
| Example 2 | metal-plated carbon fibers + LMPET 10% (60 g/m²) | 0.35 mm | 90 | 66 |
| | metal-plated carbon fibers + LMPET 20% (60 g/m²) | 0.35 mm | 87 | 65 |
| | metal-plated carbon fibers + LMPET 30% (60 g/m²) | 0.35 mm | 85 | 65 |
| Comparative example 1 | Plastic composite material 20 wt % | 0.5 mm | 85 | 54 |
| | Plastic composite material 20 wt % | 0.7 mm | 86 | 54 |

As shown from table 1 above, it was verified that the more the amount (generally referred to as "basis weight") of the metal-plated carbon fibers used in the manufacturing of the nonwoven fabrics of examples 1 and 3 above, the higher the SAR and the shielding and absorbing effectiveness. In addition, the nonwoven fabrics of the examples exhibited the same, or a more excellent, shielding effect with even about 30% of the thickness of the plastic composite material of the comparative example, and thus are suitable for slimmer electronic devices.

In addition, as a result of the test according to ASTM D 4935 for measuring efficiency of intrinsic electromagnetic waves shield for a raw material, examples 1 to 3 exhibited similar effects of electromagnetic waves shield regardless of the type. The samples were manufactured by laminating 10 nonwoven fabrics and the samples were processed, and thus the difference in the effect of electromagnetic waves shield was not great depending on the basis weight.

However, it can be seen that the samples manufactured from the nonwoven fabrics of examples 1 to 3 exhibited more excellent performance of electromagnetic waves shield by at least about 10 dB compared with the samples manufactured from the plastic nonwoven fabrics of the comparative example, and the reason is that the fiber length is longer and the fiber network structure is denser in the nonwoven fabrics of examples 1 to 3 than that in the plastic composite materials.

Figure 8:
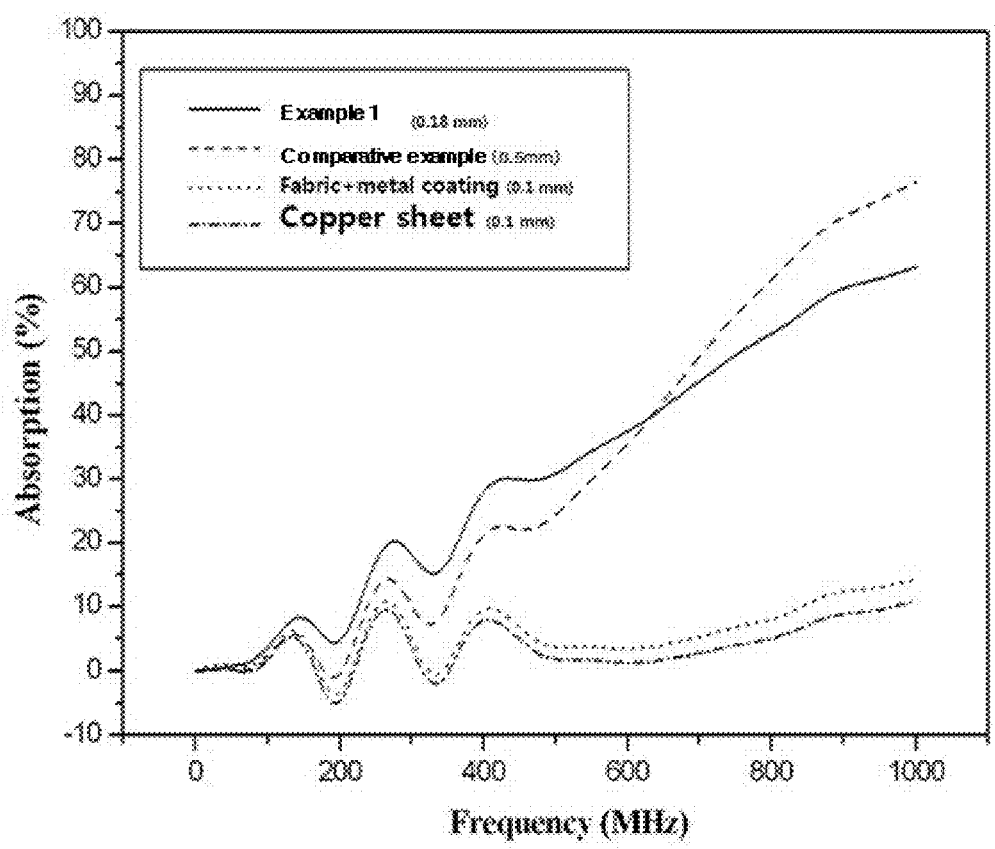
FIG. 8 is a graph showing measurement results of electromagnetic waves specific absorption rate.

Meanwhile, FIG. 8 is a graph showing measurement results of electromagnetic waves specific absorption rates of materials. The absorption rates of the nonwoven fabric and the plastic composite material were about 60-70%, but a shielding material obtained by metal-plating the woven organic fabric showed an intrinsic absorption rate of about 10%, indicating that the shielding effect of the shielding material is mainly due to reflection. This absorption rate is similar to that of a copper sheet that blocks electromagnetic waves by only a reflection action, and thus the metal-plating of densely woven fibers is far from electromagnetic waves extinction through absorption. Therefore, the nonwoven fabric and the plastic composite material used in the present invention exhibited a material intrinsic electromagnetic waves shield rate of 99.99% or higher, of which the electromagnetic waves absorption and extinction accounts for about 60-70% and the shielding rate by reflection accounts for about 29-39%.

Therefore, the present invention shows that it can manufacture a high efficient electromagnetic waves shield film or sticker that is economical and highly productive can be produced by manufacturing a nonwoven fabric using highly conductive carbon fibers prepared through continuous electroless and electrolytic processes, and laminating a finish film with an aesthetic appearance or a double-sided film on upper and lower surfaces of the nonwoven fabric, which was used as a core for blocking electromagnetic waves.

Meanwhile, the Cu/Ni double-plated carbon fibers obtained by continuous electroless and electrolytic processes, which were prepared by Bullsone Material Co. Ltd. used in examples 1 to 6, were pretreated and prepared through the following process.

Example 7

Pretreatment Step of Carbon Fibers

1) Degreasing and Softening Process

At first, a process was performed that degreases the epoxy or urethane sized on the carbon fibers and softens the surfaces of the fibers through swelling, by using an organic solvent.

The degreasing and softening process was conducted by allowing carbon fibers (12K, purchased from Toray, Hyosung, or Taekawng (TK)) to pass through a pretreatment bath containing: as a surfactant, 25 wt % of a solution in which pure water and NaOH were mixed at a weight ratio of 47:3; as organic solvents, 65 wt % of diethyl propanediol and 10 wt % of dipropylene glycol methyl ether; and, as a non-ionic surfactant (low foam), 500 ppm ethoxylated linear alcohol. The degreasing and softening process was performed at a temperature of 50° C. for 2 minutes.

2) Etching Process

An etching process was performed, in order to neutralize a strong alkali component of NaOH using sulfuric acid ($H_2SO_4$), reduce the load of a sensitizing process as a next process, and help a cleaning process and function a conditioning action using ammonium peroxysulfate (($NH_4$)$_2S_2O_8$), and to enhance the adsorption of palladium.

Specifically, an etching process for neutralization, cleaning, and conditioning was performed by allowing the carbon fibers, which had gone through the degreasing and softening processes, to pass through a pretreatment bath containing 1 wt % of sodium bisulfate ($NaHSO_3$), 0.5 wt % of sulfuric acid ($H_2SO_4$), 15 wt % of ammonium persulfate (($NH_4$)$_2S_2O_8$), and 83.5 wt % of pure water. The etching process was performed at a temperature of 20-25° C. for 2 minutes.

3) Sensitizing Process (Catalyst Imparting Process)

A sensitizing process was performed by treating the carbon fibers, which had gone through the etching process, with 20% $PdCl_2$ at a temperature of 30° C. for 2 minutes. The sensitizing process is performed in order to adsorb metal ions on the surfaces of the surface-modified carbon fibers.

4) Activating Process

An activating process is performed together with the sensitizing process. The carbon fibers were treated with 10% sulfuric acid ($H_2SO_4$) at a temperature of 50° C. for 2 minutes in order to remove Sn, that has been colloidized, and to prevent oxidation of Pd.

The carbon fibers were pretreated by the above processes.

Examples 8 and 9

Figure 9:
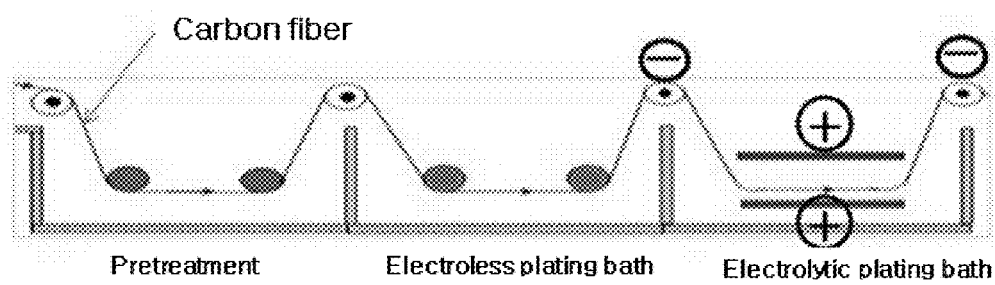
FIG. 9 shows an apparatus for surface treatment of carbon fibers, used in the present invention.

Copper and Nickel-plated Carbon Fibers Obtained by Continuous Electroless and Electrolytic Plating Processes The carbon fibers (12K, purchased from Toray) pretreated in example 7 and the carbon fibers (12K, purchased from Taekwang (TK)) pretreated in example 7 were subjected to an electroless copper plating process in the compositions and conditions shown in table 2, and then continuously subjected to an electrolytic nickel plating process in the compositions and conditions shown in table 3, using a plating apparatus shown in the accompanying FIG. 9, thereby preparing copper- and nickel-plated carbon fibers, which were then used for examples 8 and 9. Hereinafter, the contents of components of the plating solution are on the basis of 1 L of pure water.

TABLE 2

| Electroless copper plating solution | | |
|---|---|---|
| — | Component | Content (conditions) |
| Metal salt | Cu ion | 3 g/l |
| Complexing agent | EDTA | 30 g/l |

TABLE 2-continued

Electroless copper plating solution

| — | Component | Content (conditions) |
|---|---|---|
| Reducing agent | Formalin | 3.0 g/l |
| Stabilizer | TEA (triethanolamine) | 3 g/l |
|  | 2,2'-bipiridine | 0.01 g/l |
| pH adjusting agent | NaOH (25%) | 12 ml/l |
|  | Temperature | 38° C. |
|  | pH | 12.5 |
|  | Treatment time | 6 min |

TABLE 3

Electroytic Ni plating solution

| — | Component | Content (conditions) |
|---|---|---|
| Electrolytic plating solution | Nickel metal salt | $Ni(NH_2SO_3)_2$ 300 g/l |
|  |  | $NiCl_2$ 20 g/l |
|  | pH buffer | $H_3BO_3$ 40 g/l |
|  | Temperature | 55° C. |
|  | pH | 4.2 |
|  | Treatment time | 1 min |

Example 10

Copper and Nickel-plated Carbon Fibers Obtained by Continuous Electroless and Electrolytic Plating Processes The carbon fibers pretreated in example 7 were subjected to an electroless copper plating process in the compositions and conditions shown in table 4, and then continuously subjected to an electrolytic nickel plating process in the compositions and conditions shown in table 5, using a plating apparatus in the accompanying FIG. 9, thereby preparing copper- and nickel-plated carbon fibers.

TABLE 4

Electroless copper plating solution

| — | Component | Content (conditions) |
|---|---|---|
| Metal salt | Cu ion | 2.5-3.5 g/l |
| Complexing agent | EDTA | 25-35 g/l |
| Reducing agent | Formalin | 2.5-3.5 g/l |
| Stabilizer | TEA (triethanolamine) | 2-3 g/l |
|  | 2,2'-bipiridine | 0.008-0.01 g/l |
| pH adjusting agent | NaOH (25%) | 8-12 ml/l |
|  | Temperature | 36-40° C. |
|  | pH | 12-13 |
|  | Treatment time | 6-10 min |

TABLE 5

Electrolytic Ni plating solution

| — | Component | Content (conditions) |
|---|---|---|
| Electrolytic plating solution | Nickel metal salt | $Ni(NH_2SO_3)_2$ 280-320 g/l |
|  |  | $NiCl_2$ 15-25 g/l |
|  | pH buffer | $H_3BO_3$ 35-45 g/l |
|  | Temperature | 50-55° C. |
|  | pH | 4.0-4.2 |
|  | Treatment time | 1-3 min |

For the electrolytic plating, a constant voltage (CV) of 5-10 V was applied to an electrolytic nickel bath. A Ni metal plate or Ni balls were used for a metal plate used as a positive electrode.

Example 11

Copper and Nickel-plated Carbon Fibers Obtained by Continuous Electroless and Electrolytic Plating Processes The carbon fibers pretreated in example 7 were subjected to an electroless copper plating process in the compositions and conditions shown in table 6, and then continuously subjected to an electrolytic nickel plating process in the compositions and conditions shown in table 7, using a plating apparatus in the accompanying FIG. 9, thereby preparing copper- and nickel-plated carbon fibers.

TABLE 6

Electroless copper plating solution

| — | Component | Content (conditions) |
|---|---|---|
| Metal salt | Cu ion | 4.5-5.5 g/l |
| Complexing agent | EDTA | 45-55 g/l |
| Reducing agent | Formalin | 3.5-4.5 g/l |
| Stabilizer | TEA (triethanolamine) | 4-6 g/l |
|  | 2,2'-bipiridine | 0.01-0.15 g/l |
| pH adjusting agent | NaOH (25%) | 8-12 ml/l |
|  | Temperature | 40-45° C. |
|  | pH | 12-13 |
|  | Treatment time | 6-10 min |

TABLE 7

Electrolytic Ni plating solution

| — | Component | Content (conditions) |
|---|---|---|
| Electrolytic plating solution | Nickel metal salt | $Ni(NH_2SO_3)_2$ 280-320 g/l |
|  |  | $NiCl_2$ 15-25 g/l |
|  | pH buffer | $H_3BO_3$ 35-45 g/l |
|  | Temperature | 50-55° C. |
|  | pH | 4.0-4.2 |
|  | Treatment time | 1-3 min |

For the electrolytic plating, a constant voltage (CV) of 5-10 V was applied to an electrolytic nickel bath. A Ni metal plate or Ni balls were used for a metal plate used as a positive electrode.

Test Example 2

Measurement on Change in Current Density and Linear Resistance Value of Plated Carbon Fiber The optimization conditions for electroless and electrolytic plating were set by adjusting the concentration of NaOH, which adjusts pH, and the concentration of HCHO, which helps the reduction reaction of Cu, among the compositions and conditions for preparing copper- and nickel-plated carbon fibers in example 10.

While the amount of 25% NaOH was changed to 8, 9, 10, 11, and 12 ml/l, and the amount of HCHO was changed to 2.5, 2.7, 2.9, 3.1, and 3.3 g/l, respectively, the change in the current density (A) that flows through the carbon fibers was measured, and the linear resistance (Ω/30 cm) of the finally obtained products (copper and nickel-plated carbon fibers)

was evaluated, and the results were summarized in table 8 below. A constant voltage (CV) of 7 V was applied to an electrolytic nickel bath, and the other conditions that were uniformly maintained were summarized in tables 9 and 10 below.

TABLE 8

| HCHO | NaOH | Current density (A) | Resistance (Ω/30 cm) | Plating sol. period of use |
|---|---|---|---|---|
| 2.5 | 8  | 100 | 0.8 | 10 turn |
|     | 9  | 110 | 0.6 |         |
|     | 10 | 120 | 0.4 |         |
|     | 11 | 130 | 0.3 |         |
|     | 12 | 140 | 0.2 |         |
| 2.7 | 8  | 110 | 0.7 | 8 turn  |
|     | 9  | 120 | 0.6 |         |
|     | 10 | 130 | 0.5 |         |
|     | 11 | 140 | 0.3 |         |
|     | 12 | 150 | 0.2 |         |
| 2.9 | 8  | 120 | 0.6 | 6 turn  |
|     | 9  | 130 | 0.5 |         |
|     | 10 | 140 | 0.4 |         |
|     | 11 | 150 | 0.3 |         |
|     | 12 | 160 | 0.2 |         |
| 3.1 | 8  | 130 | 0.6 | 4 turn  |
|     | 9  | 140 | 0.5 |         |
|     | 10 | 150 | 0.4 |         |
|     | 11 | 160 | 0.3 |         |
|     | 12 | 170 | 0.2 |         |
| 3.3 | 8  | 140 | 0.5 | 2 turn  |
|     | 9  | 150 | 0.4 |         |
|     | 10 | 160 | 0.3 |         |
|     | 11 | 170 | 0.2 |         |
|     | 12 | 180 | 0.1 |         |

In table 8 above, 1 turn represents 1 make-up amount of electroless copper plating.

TABLE 9

Electroless copper plating solution

| — | Component | Content (conditions) |
|---|---|---|
| Metal salt | Cu ion | 3 g/l |
| Complexing agent | EDTA | 30 g/l |
| Reducing agent | Formalin (HCHO) | 2.5-3.3 g/l |
| Stabilizer | TEA (triethanolamine) | 3 g/l |
|  | 2,2'-bipiridine | 0.10 g/l |
| pH adjusting agent | NaOH (25%) | 8-12 ml/l |
| Temperature |  | 37° C. |
| pH |  | 12.5 |
| Treatment time |  | 6 min |

TABLE 10

Electrolytic plating solution

| — | Component | Content (conditions) |
|---|---|---|
| Electrolytic plating solution | Nickel metal salt | Ni(NH$_2$SO$_3$)$_2$ 300 g/l |
|  |  | NiCl$_2$ 20 g/l |
|  | pH buffer | H$_3$BO$_3$ 40 g/l |
| Temperature |  | 55° C. |
| pH |  | 4.2 |
| Treatment time |  | 1 min |
| Constant voltage (Cv) |  | 7 V |

As can be confirmed from table 8 above, as the amounts of the reducing agent and NaOH were increased, the plating rate increased, but the lifespan of the plating solution was shortened. Therefore, it may be preferable to maintain the amount of the reducing agent at the minimum (2.5-3.0 g/l) and increase the amount of NaOH to the maximum.

Test Example 3

Test on Plating Rate and Solution Stability

For the test on plating rate and stability to solution through the adjustment of the concentrations of copper ions and a complexing agent (EDTA), the optimization conditions for copper plating were tested by adjusting the amount of the reducing agent (table 11) when the copper ions and the complexing agent were increased at the same ratio, and the other conditions that were uniformly maintained were summarized in tables 12 and 13 below.

TABLE 11

| Metal salt (Cu) | Reducing agent (HCHO) | Complexing agent (EDTA) | NaOH | Plating thickness (μm) |
|---|---|---|---|---|
| 2.5 | 2.5 | 25 | 12 | 0.2-0.3 |
| 3.5 | 3.0 | 35 |    | 0.3-0.5 |
| 4.5 | 3.5 | 45 |    | 0.4-0.6 |
| 5.5 | 4   | 55 |    | 0.5-0.8 |

TABLE 12

Electroless copper plating solution

| — | Component | Content (conditions) |
|---|---|---|
| metal salt | Cu ion | 2.5-5.5 g/l |
| Complexing agent | EDTA | 25-55 g/l |
| Reducing agent | Formalin | 2.5-4 g/l |
| Stabilizer | TEA(triethanolamine) | 3 g/l |
|  | 2,2'-bipiridine | 0.01 g/l |
| pH adjusting agent | NaOH(25%) | 12 ml/l |
| Temperature |  | 37° C. |
| pH |  | 12.5 |
| Treatment time |  | 6 min |

TABLE 13

Electrolytic plating solution

| — | Component | Content (conditions) |
|---|---|---|
| Electrolytic plating solution | Nickel metal salt | Ni(NH$_2$SO$_3$)$_2$ 300 g/l |
|  |  | NiCl$_2$ 20 g/l |
|  | pH buffer | H$_3$BO$_3$ 40 g/l |
| Temperature |  | 55° C. |
| pH |  | 4.2 |
| Treatment time |  | 1 min |
| C.V |  | 7 V |

As can be seen from table 11 above, it was verified that, as the concentrations of copper and HCHO were higher, high-rate plating was allowable, and the thickness of the plating layer was increased (plating thickness: 0.7 μm or more). For a preferable plating thickness, 0.3 μm, of the carbon fiber, the best products were obtained when the concentration of copper ions was 2.5-3.0 g/l and the concentration of HCHO was 2.5-3.0 g/l.

As the plating thickness of the carbon fiber increases, the specific gravity increases and the strength, elastic modulus, and strain deteriorate, and thus carbon fibers with excellent electrical conductivity were prepared by conducting Ni electrolytic plating on Cu pores in a shorter time after the electroless plating, rather than compulsorily increasing the plating thickness in the electroless plating.

Test Example 4

Comparison of Physical Properties and Electrical Conductivity

Table 12 shows comparison of physical properties, electrical conductivity, and the like, between copper and nickel-plated carbon fibers in examples 8 and 9 and nickel-plated carbon fibers on the market prepared by an electroless plating process, as comparative example 2.

TABLE 12

| | Comparative example 2 | Example 8 | Example 9 | Note |
|---|---|---|---|---|
| Strand strength (kgf/mm$^2$)(Range) | 280 | 380 (367~405) | 338 (325~353) | — |
| elastic modulus (tons/mm$^2$) | 22.0 | 20.0 | 22.5 | — |
| Strain (%) | 1.2 | 1.9 | 1.5 | — |
| Specific gravity (g/cm$^3$) | 2.70 | 2.7277 | 2.7894 | — |
| Diameter (μm) | 7.5 | 7.828 | 7.705 | — |
| Tex (fiber thickness) | 1420 | 1575 | 1561 | — |
| Electric resistance (Ω/m) | — | 0.8 | 0.7 | — |
| Electric resistance (Ω cm) | 7.5 × 10$^{-5}$ | 4.62 × 10$^{-5}$ | 4.05 × 10$^{-5}$ | — |
| Electric resistance compared with normal CF | — | 32-fold reduction | 37-fold reduction | Normal CF: 1.50 × 10$^{-3}$ Ω cm |
| Coating thicknss (nm) | 250 | 240 (210~271) | 350 (305~392) | — |

As can be seen from table 12 above, the copper and nickel-plated carbon fibers had excellent physical properties and exhibited excellent electrical conductivity values due to the low electric conductivity values, compared with comparative example 2 prepared by the electroless plating process.

Although the present invention has been described in detail with reference to the specific features, it will be apparent to those skilled in the art that this description is only for a preferred example and does not limit the scope of the present invention. Thus, the substantial scope of the present invention will be defined by the appended claims and equivalents thereof.

What is claimed is:

1. A method for manufacturing a nonwoven fabric for shielding and absorbing electromagnetic waves comprising:
   (a) copper plating the carbon fiber to pass through an electroless plating solution,
   wherein the electroless plating solution comprises 2.5-3.5 g/L Cu ions, 25-35 g/L EDTA, 2.5-3.5 g/L formalin, 2-3 g/L triethanolamine (TEA), 8-12 mL/L 25% NaOH, and 0.008-0.01 g/L 2,2'-bipiridine on the basis of the volume of pure water,
   wherein the electroless plating solution has pH of 12-13 and a temperature of 36-45° C.;
   (b) nickel plating the copper-plated carbon fiber to pass through an electrolytic plating solution,
   wherein the electrolytic plating solution containing 280-320 g/L Ni(NH$_2$SO$_3$)$_2$, 15-25 g/L NiCl$_2$ and 35-45 g/L H$_3$BO$_3$,
   wherein the electrolytic plating solution has pH of 4.0-4.2 and a temperature of 50-60° C.;
   (c) cutting copper and nickel-plated carbon fibers into chopped carbon fibers with a length of 3-500 mm;
   (d) mixing and dispersing the chopped copper and nickel-plated carbon fibers, which correspond to a resultant product in step (c), with water at a weight ratio of 1:100-600;
   (e) adding 3-30%(w/v) of the resultant product in step (d) to water, followed by dispersing; and
   (f) filtering the resultant product in step (e) and removing water.

2. The method of claim 1, wherein the mixing in step (d) is performed by further adding, as a nonwoven fabric strength reinforcing agent, natural pulp or a low-melting thermoplastic resin.

3. The method of claim 2, wherein the nonwoven fabric strength reinforcing agent is added in 1-50 wt % on the basis of the total weight of the chopped copper and nickel-plated carbon nanofibers, which correspond to a resultant product in step (c), and the nonwoven fabric strength reinforcing agent.

4. The method of claim 2, wherein the low-melting thermoplastic resin is low-melting polyethylene terephthalate (LMPET).

5. The method of claim 1, wherein the mixing in step (d) is performed by further adding: as a magnetic and ferromagnetic additive, one metal or an alloy of two or more metals selected from the group consisting of iron, nickel, and cobalt; or as a carbon-based additive, an additive selected from the group consisting of carbon nanotubes, graphite, carbon block or metal-plated carbon-based additives thereof, ferrites, and inorganic-based additives.

6. The method of claim 1, wherein in step (e), a water-soluble adhesive or a water-soluble polymer is further added in 0.1-50 wt % on the basis of the total weight of the resultant product in step (c).

7. The method of claim 1, further comprising (g) after step (f), immersing the nonwoven fabric, which is a resultant product in step (f), in a mixture solution in which a thermoplastic resin is dissolved in a solvent selected from the group consisting of toluene, acetone, alcohol, tetrahydrofurane (THF), cyclohexane, and xylene, the content of the thermoplastic resin being 0.1-10 wt % on the basis of the total weight of the solvent, or spraying the mixture solution on the nonwoven fabric, which is a resultant product in step (f).

8. The method of claim 1, further comprising (h) drying the resultant product in step (f) or (g) at 50-150° C. for 10 minutes to 3 hours.

* * * * *